(12) United States Patent
Iwami et al.

(10) Patent No.: US 7,913,346 B2
(45) Date of Patent: Mar. 29, 2011

(54) SUBSTRATE TREATMENT APPARATUS AND SUBSTRATE TREATMENT METHOD

(75) Inventors: Masaki Iwami, Kyoto (JP); Soichi Nadahara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1103 days.

(21) Appl. No.: 11/396,820

(22) Filed: Mar. 28, 2006

(65) Prior Publication Data

US 2006/0219260 A1 Oct. 5, 2006

(30) Foreign Application Priority Data

Mar. 30, 2005 (JP) .................. 2005-099367
Mar. 30, 2005 (JP) .................. 2005-099368

(51) Int. Cl.
B08B 11/02 (2006.01)
(52) U.S. Cl. ................ 15/77; 15/88.2; 15/102
(58) Field of Classification Search ............. 15/77, 88.2, 15/88.4, 102
See application file for complete search history.

(56) References Cited

U.S. PATENT DOCUMENTS

| 5,647,083 | A | 7/1997 | Sugimoto et al. |
| 5,693,148 | A | 12/1997 | Simmons et al. |
| 6,175,983 | B1 * | 1/2001 | Hirose et al. ............... 15/102 |

FOREIGN PATENT DOCUMENTS

| JP | 7-283192 | 10/1995 |
| JP | 8-321481 | 12/1996 |
| JP | 10-256206 | 9/1998 |
| JP | 11-135469 | 5/1999 |
| JP | 2000-208462 | 7/2000 |
| JP | 2000-208466 | 7/2000 |
| JP | 2003-332287 | 11/2003 |

OTHER PUBLICATIONS

Korean Office Action was issued on Mar. 22, 2007 in connection with the Korean Patent Application No. 10-2006-0026379.
Japanese Office Action issued Jan. 7, 2010 in connection with corresponding Japanese Patent Application No. 2005-099367.
Japanese Office Action issued Apr. 1, 2010 in connection with corresponding Japanese Patent Application No. 2005-099368 (JP11-135469 was previously submitted in an IDS filed Feb. 8, 2010 and is therefore not enclosed.).

* cited by examiner

*Primary Examiner* — Randall Chin
(74) *Attorney, Agent, or Firm* — Ostrolenk Faber LLP (57) ABSTRACT

A substrate treatment apparatus includes a substrate holding mechanism which holds a substrate, a scrub brush for scrubbing a surface of the substrate held by the substrate holding mechanism to remove foreign matter from the substrate surface, a treatment liquid supplying mechanism which supplies an alkaline treatment liquid to the substrate surface when the substrate is scrubbed with the scrub brush, and an alkaline fluid supplying mechanism which supplies an alkaline fluid to a surface of the scrub brush in a standby period during which no substrate is scrubbed with the scrub brush.

9 Claims, 8 Drawing Sheets

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for removing foreign matter from a surface of a substrate by scrubbing the substrate surface. Exemplary substrates to be treated include semiconductor wafers, glass substrates for liquid crystal display devices, glass substrates for plasma display devices, substrates for FED (Field Emission Display) devices, substrates for optical disks, substrates for magnetic disks, substrates for magneto-optical disks, and substrates for photo masks.

2. Description of Related Art

In a semiconductor device production process, it is indispensable to perform a substrate cleaning operation between process steps for cleaning a substrate (semiconductor wafer). Substrate treatment apparatuses of a single substrate treatment type which are adapted to clean substrates one by one typically include a substrate holding/rotating mechanism for generally horizontally holding and rotating a substrate, a sponge-like scrub brush for scrubbing a surface of the substrate held and rotated by the substrate holding/rotating mechanism, and a treatment liquid nozzle for supplying a cleaning agent (ammonia water or an ammonia-hydrogen peroxide mixture) to the substrate held and rotated by the substrate holding/rotating mechanism.

The scrub brush is attached to a distal end of a pivot arm, for example, which is horizontally pivotal about a pivot axis located outside a substrate rotation region. When the pivot arm is driven with the scrub brush pressed against the surface of the rotating substrate, the substrate surface is scanned with the scrub brush thereby to be scrubbed. Thus, foreign matter can be removed from the entire substrate surface.

As the scrub-cleaning operation is performed on a multiplicity of substrates, foreign matter on the substrates is transferred to the scrub brush and accumulated in the scrub brush. For suppression of the accumulation of the foreign matter, a scrub brush rinsing operation for rinsing the scrub brush with water is performed in a standby period when no substrate is loaded for treatment for a relatively long period. More specifically, a scrub brush standby position is defined outside the substrate rotation region, and a cleaning pot is provided in the standby position (see, for example, U.S. Pat. No. 5,647,083). The cleaning pot is a tubular container which is capable of accommodating the scrub brush. A deionized water nozzle for supplying deionized water to the scrub brush is provided in the cleaning pot, and a drain pipe is connected to a bottom of the cleaning pot. With this arrangement, the deionized water is supplied from the deionized water nozzle to the scrub brush to wash away the foreign matter from the scrub brush in the standby period.

However, studies conducted by the inventors of the present invention unexpectedly show that a greater amount of foreign matter (particles) apparently remains on a substrate treated by the scrub brush for the first time after the scrub brush is subjected to the rinsing operation in the standby period (the first substrate) than on a substrate subsequently treated by the scrub brush (the second or subsequent substrate).

This phenomenon is supposedly attributable to a change in the zeta potential of the foreign matter adhering to the scrub brush.

The substrate (semiconductor wafer) generally has a negative zeta potential. Therefore, it is effective to cause the foreign matter to have a negative zeta potential for easy removal of the foreign matter from the substrate. For this purpose, ammonia water or an ammonia-hydrogen peroxide mixture is supplied as the cleaning agent to the substrate surface in the scrub-cleaning operation.

However, the surface of the scrub brush supplied with the deionized water in the cleaning pot is liable to have a lower pH. When the scrub brush having a lower pH is pressed against the substrate surface, foreign matter brought into contact with the scrub brush has a positive zeta potential. This supposedly makes it difficult to remove the foreign matter from the substrate surface. When the scrub-cleaning operation is thereafter repeated by supplying the alkaline cleaning agent, the scrub brush abundantly absorbs the alkaline cleaning agent. Therefore, the aforesaid phenomenon is eliminated.

This is supposedly a mechanism that causes the apparent cleaning failure on the first substrate after the standby period.

SUMMARY OF THE INVENTION

It is an object of the present invention to provide a substrate treatment apparatus and a substrate treatment method which ensure more reliable removal of foreign matter from a substrate surface.

An inventive substrate treatment apparatus comprises a substrate holding mechanism which holds a substrate, a scrub brush for scrubbing a surface of the substrate held by the substrate holding mechanism to remove foreign matter from the substrate surface, and an alkaline fluid supplying mechanism which supplies an alkaline fluid to a surface of the scrub brush in a standby period during which no substrate is scrubbed with the scrub brush.

According to one aspect of the present invention, a substrate treatment apparatus comprises a substrate holding mechanism which holds a substrate, a scrub brush for scrubbing a surface of the substrate held by the substrate holding mechanism to remove foreign matter from the substrate surface, a treatment liquid supplying mechanism which supplies an alkaline treatment liquid to the substrate surface when the substrate is scrubbed with the scrub brush, and an alkaline fluid supplying mechanism which supplies an alkaline fluid to a surface of the scrub brush in a standby period during which no substrate is scrubbed with the scrub brush. The substrate holding mechanism may be a substrate holding/rotating mechanism which holds and rotates the substrate.

With this arrangement, the surface of the scrub brush is kept alkaline (at a pH higher than 7, preferably not lower than 9, more preferably not lower than 10) by the alkaline treatment liquid supplied to the substrate surface from the treatment liquid supplying mechanism when the substrate is scrubbed with the scrub brush. In the standby period during which no substrate is scrubbed with the scrub brush, on the other hand, the surface of the scrub brush is also kept alkaline (at a pH higher than 7, preferably not lower than 9, more preferably not lower than 10) by supplying the alkaline fluid to the scrub brush surface from the alkaline fluid supplying mechanism.

Therefore, the surface of the scrub brush is kept alkaline both during the substrate scrubbing operation and in the standby period. Thus, the surface of the scrub brush and foreign matter adhering to the scrub brush surface are each constantly kept at a negative zeta potential. Hence, there is no possibility that the zeta potential of the foreign matter on the substrate (generally kept at a negative zeta potential) becomes positive to make it difficult to remove the foreign matter from the substrate when the scrub brush is brought into contact with the substrate after the standby period. Since not only the zeta potential of the foreign matter on the scrub brush surface but also the zeta potential of the scrub brush per se are controlled to be negative, there is no possibility that the foreign matter firmly adheres to the scrub brush. Therefore, the accumulation of the foreign matter on the scrub brush surface can be suppressed during the substrate scrubbing operation.

The alkaline fluid is a fluid which causes the scrub brush and the foreign matter adhering to the surface of the scrub brush to have a negative zeta potential and, more specifically, an alkaline liquid or gas which causes the surface of the scrub brush to have a pH higher than 7 (preferably not lower than 9, more preferably not lower than 10). An example of the alkaline fluid is ammonia. Therefore, ammonia water is preferably supplied to the scrub brush. The ammonia water is a volatile aqueous solution from which ammonia gas is liberated. Therefore, ammonia gas emanating from ammonia water having a proper ammonia concentration (e.g., having a pH not lower than 10) may be supplied as the alkaline gas to the scrub brush. The alkaline fluid is not limited to the ammonia water, but may be an aqueous solution containing at least one of $NH_4^+$, $RNH_3^+$, $R_2NH_2^+$, $R_3NH^+$ and $R_4N^+$ ions, wherein R is an alkyl group.

Similarly, the alkaline treatment liquid is a liquid which can cause the scrub brush and the foreign matter adhering to the surface of the scrub brush to have a negative zeta potential and, more specifically, a liquid which can cause the surface of the scrub brush to have a pH higher than 7 (preferably not lower than 9, more preferably not lower than 10). Examples of the alkaline treatment liquid include ammonia water, an ammonia-hydrogen peroxide mixture, and an aqueous solution containing at least one of $NH_4^+$, $RNH_3^+$, $R_2NH_2^+$, $R_3NH^+$ and $R_4N^+$ ions.

The alkaline treatment liquid and the alkaline fluid may contain different alkaline substances, but the treatment liquid supplying mechanism and the alkaline fluid supplying mechanism are preferably adapted to respectively supply a liquid and a fluid which contain the same alkaline substance. Thus, the change in the state of the scrub brush surface can be further suppressed during the scrubbing operation and in the standby period, and the scrub brush surface can be assuredly kept at a negative zeta potential.

The treatment liquid supplying mechanism and the alkaline fluid supplying mechanism more preferably supply the same type of alkaline liquids, and further more preferably supply the same type of alkaline liquids having substantially the same concentration. Thus, the state of the scrub brush surface can be kept substantially constant both during the scrubbing operation and in the standby period.

The treatment liquid supplying mechanism preferably supplies the alkaline treatment liquid so as to keep the surface of the scrub brush at a pH not lower than 9 (more preferably not lower than 10) during the scrubbing of the substrate, and the alkaline fluid supplying mechanism preferably supplies the alkaline fluid so as to keep the surface of the scrub brush at a pH not lower than 9 (more preferably not lower than 10) in the standby period.

With this arrangement, the surface of the scrub brush is kept at a pH not lower than 9 both during the scrubbing operation and in the standby period, whereby the surface of the scrub brush and the foreign matter adhering to the scrub brush surface can be each assuredly kept at a negative zeta potential.

The alkaline fluid supplying mechanism preferably supplies the alkaline fluid to the scrub brush so as to keep the surface of the scrub brush in the standby period at a pH lower than the pH of the scrub brush surface observed during the scrubbing of the substrate.

With this arrangement, the concentration of the alkaline fluid to be supplied to the scrub brush in the standby period can be reduced as compared with the alkaline treatment liquid. This makes it possible to keep the scrub brush surface alkaline while suppressing the consumption of the alkaline fluid.

The substrate treatment apparatus may further comprise a brush moving mechanism which moves the scrub brush between a treatment position in which the substrate surface is scrubbed and a standby position to which the scrub brush is retracted from the treatment position. In this case, the alkaline fluid supplying mechanism preferably supplies the alkaline fluid to the scrub brush when the scrub brush is located in the standby position.

With this arrangement, the scrub brush is moved between the treatment position and the standby position by the brush moving mechanism. Thus, the alkaline fluid can be supplied to the scrub brush in the standby position with a simple construction.

The alkaline fluid supplying mechanism may supply a volatile alkaline liquid from which an alkaline gas is liberated. Thus, the alkaline substance can be supplied in a gaseous form to the scrub brush. For example, an alkaline liquid retaining portion which retains the volatile alkaline liquid may be provided below the standby position, whereby the alkaline gas emanating from the alkaline liquid retained in the alkaline liquid retaining portion can be supplied to the scrub brush. This arrangement drastically reduces the consumption of the alkaline liquid as compared with a case where the alkaline liquid is directly supplied to the scrub brush, thereby lowering the running costs. Even if the alkaline liquid is directly supplied to the scrub brush, the alkaline substance can be supplied both in a liquid form and in a gaseous form to the scrub brush by retaining the alkaline liquid in the alkaline liquid retaining portion.

"The volatile alkaline liquid" may be a liquid, such as ammonia water, which has volatility at a room temperature (e.g., 23° C.), or may be a liquid from which the alkaline gas is liberated by heating the liquid up to a temperature higher than the room temperature. The term "volatility" is herein defined as the property of a liquid of liberating a gas or vapor therefrom. Where the heating is required for the emanation of the alkaline gas, a heating mechanism may be provided for heating the alkaline liquid retaining portion, or the alkaline liquid may be preliminarily heated to the higher temperature outside the alkaline liquid retaining portion and then supplied to the alkaline liquid retaining portion.

Since the concentration of the alkaline substance in the alkaline liquid is gradually reduced due to the emanation of the alkaline gas, the substrate treatment apparatus may preferably further comprise an alkaline liquid supplying mechanism which supplies the alkaline liquid to the alkaline liquid retaining portion as required.

According to another aspect of the present invention, a substrate treatment method comprises the steps of: scrubbing a surface of a substrate with a scrub brush to remove foreign matter from the substrate surface; supplying an alkaline treatment liquid to the substrate surface in parallel with the scrubbing step; and supplying an alkaline fluid to a surface of the scrub brush to keep the scrub brush and foreign matter adhering to the scrub brush at a negative zeta potential in a standby period during which no substrate is scrubbed with the scrub brush.

According to further another aspect of the present invention, a substrate treatment apparatus comprises a substrate holding mechanism which holds a substrate, a scrub brush for scrubbing a surface of the substrate held by the substrate holding mechanism to remove foreign matter from the substrate surface, and an alkaline gas supplying mechanism which supplies an alkaline gas to a surface of the scrub brush in a standby period during which no substrate is scrubbed with the scrub brush.

With this arrangement, the alkaline gas is supplied to the surface of the scrub brush in the standby period, whereby the zeta potential of the surface of the scrub brush and the zeta potential of foreign matter adhering to the scrub brush surface are controlled to be negative. Hence, there is less possibility that the zeta potential of the foreign matter on the substrate (generally kept at a negative zeta potential) becomes positive to make it difficult to remove the foreign matter from the substrate when the scrub brush is brought into contact with the substrate after the standby period. Since not only the zeta potential of the foreign matter on the scrub brush surface but also the zeta potential of the scrub brush per se are controlled to be negative, there is less possibility that the foreign matter firmly adheres to the scrub brush. Therefore, the accumulation of the foreign matter on the scrub brush surface can be suppressed during the substrate scrubbing operation.

The alkaline gas is a gas which causes the scrub brush and the foreign matter adhering to the scrub brush surface to have a negative zeta potential and, more specifically, a gas which is capable of keeping the surface of the scrub brush at a pH not lower than 9. An example of the alkaline gas is ammonia. Ammonia water is a volatile aqueous solution from which ammonia gas is liberated. Therefore, ammonia gas emanating from ammonia water having a proper ammonia concentration (e.g., having a pH not lower than 10) may be supplied as the alkaline gas to the scrub brush. The volatile aqueous solution from which the alkaline gas is liberated is not limited to the ammonia water, but may be an aqueous solution containing at least one of $NH_4^+$, $RNH_3^+$, $R_2NH_2^+$, $R_3NH^+$ and $R_4N^+$ ions, wherein R represents an alkyl group.

The substrate holding mechanism may be a substrate holding/rotating mechanism which holds and rotates the substrate.

The substrate treatment apparatus preferably further comprises a treatment liquid supplying mechanism which supplies a treatment liquid to the substrate surface when the substrate is scrubbed with the scrub brush. With this arrangement, the foreign matter removed from the substrate surface by the scrub brush is washed away from the substrate by the treatment liquid. When the alkaline gas is supplied to the scrub brush wetted with the treatment liquid in the standby period, the surface portion of the scrub brush is kept wetted with the alkaline liquid. Thus, the substrate can be efficiently scrub-cleaned after the standby period.

The treatment liquid is preferably an alkaline liquid and, more specifically, ammonia water or an ammonia-hydrogen peroxide mixture. Since the zeta potential of the foreign matter on the substrate can be controlled to be negative with the use of the treatment liquid, the foreign matter can be efficiently removed from the substrate surface. The treatment liquid is not limited to the ammonia water and the ammonia-hydrogen peroxide mixture, but may be an aqueous solution containing at least one of $NH_4^+$, $RNH_3^+$, $R_2NH_2^+$, $R_3NH^+$ and $R_4N^+$ ions.

The substrate treatment apparatus may further comprise a brush moving mechanism which moves the scrub brush between a treatment position in which the substrate surface is scrubbed and a standby position to which the scrub brush is retracted from the treatment position. In this case, the alkaline gas supplying mechanism preferably supplies the alkaline gas to the scrub brush when the scrub brush is located in the standby position. With this arrangement, the scrub brush is moved between the treatment position and the standby position by the brush moving mechanism. Thus, the alkaline gas can be supplied to the scrub brush located in the standby position with a simple construction.

The substrate treatment apparatus preferably further comprises a cleaning liquid supplying mechanism which supplies a cleaning liquid to the scrub brush located in the standby position. With this arrangement, the scrub brush is cleaned in the standby position, so that the foreign matter can be removed from the scrub brush. At the same time, the alkaline gas is supplied to the scrub brush in the standby position, so that the zeta potential of the scrub brush and the zeta potential of foreign matter slightly remaining on the scrub brush surface can be controlled to be negative. Thus, the substrate can be more efficiently cleaned.

Further, the scrub brush is kept wetted with the cleaning liquid and the alkaline gas is supplied to the wetted scrub brush, whereby the scrub brush is kept wetted with the alkaline liquid. Thus, the substrate can be efficiently scrub-cleaned immediately after the standby period.

At least one of deionized water, reductive water (hydrogen water) and ion water (particularly, ionized alkaline water) is used as the cleaning liquid. Particularly, where the reductive water (hydrogen water) or the ionized alkaline water is used as the cleaning liquid, the zeta potential of the scrub brush and the zeta potential of foreign matter slightly remaining on the scrub brush surface can be assuredly controlled to be negative.

The alkaline gas supplying mechanism may include an alkaline liquid retaining portion provided below the standby position for retaining a volatile alkaline liquid from which the alkaline gas is liberated.

With this arrangement, the volatile alkaline liquid is retained in the alkaline liquid retaining portion, and the alkaline gas emanating from the volatile alkaline liquid is supplied to the scrub brush. This arrangement drastically reduces the consumption of the alkaline liquid as compared with a case where the alkaline liquid is directly supplied to the scrub brush, thereby keeping the running costs low.

"The volatile alkaline liquid" may be a liquid, such as ammonia water, which has volatility at a room temperature (e.g., 23° C.), or may be a liquid from which the alkaline gas is liberated by heating the liquid up to a temperature higher than the room temperature. Where the heating is required for the emanation of the alkaline gas, a heating mechanism may be provided for heating the alkaline liquid retaining portion, or the alkaline liquid may be preliminarily heated to a high temperature outside the alkaline liquid retaining portion and then supplied to the alkaline liquid retaining portion.

Since the concentration of the alkaline substance in the alkaline liquid is gradually reduced due to the emanation of the alkaline gas, the substrate treatment apparatus preferably further comprises an alkaline liquid supplying mechanism which supplies the alkaline liquid to the alkaline liquid retaining portion as required.

The substrate treatment apparatus preferably further comprises a liquid receiving member provided above the alkaline liquid retaining portion for suppressing or preventing intrusion of any other liquid into the alkaline liquid retaining portion. With this arrangement, the liquid receiving member is provided for the prevention of the intrusion of any other liquid (any liquid other than the alkaline liquid) into the alkaline liquid retaining portion, thereby preventing the alkaline liquid in the alkaline liquid retaining portion from being inadvertently diluted. Thus, a required amount of the alkaline gas can be assuredly supplied to the scrub brush.

This arrangement is particularly preferred where the cleaning liquid supplying mechanism is provided for supplying the cleaning liquid to the scrub brush. Thus, the dilution of the alkaline liquid with the cleaning liquid can be suppressed or prevented.

According to still another aspect of the present invention, a substrate treatment method comprises the steps of: scrubbing a surface of a substrate with a scrub brush to remove foreign matter from the substrate surface; and supplying an alkaline gas to a surface of the scrub brush to cause the scrub brush and foreign matter adhering to the scrub brush to have a negative zeta potential in a standby period during which no substrate is scrubbed with the scrub brush.

This method preferably further comprises the step of supplying a treatment liquid to the substrate surface in parallel with the scrubbing step.

The method preferably further comprises the step of supplying a cleaning liquid to the scrub brush in the standby period.

The foregoing and other objects, features and advantages of the present invention will become more apparent from the following detailed description of preferred embodiments with reference to the attached drawings.

DETAILED DESCRIPTION OF PREFERRED EMBODIMENTS

Figure 1:
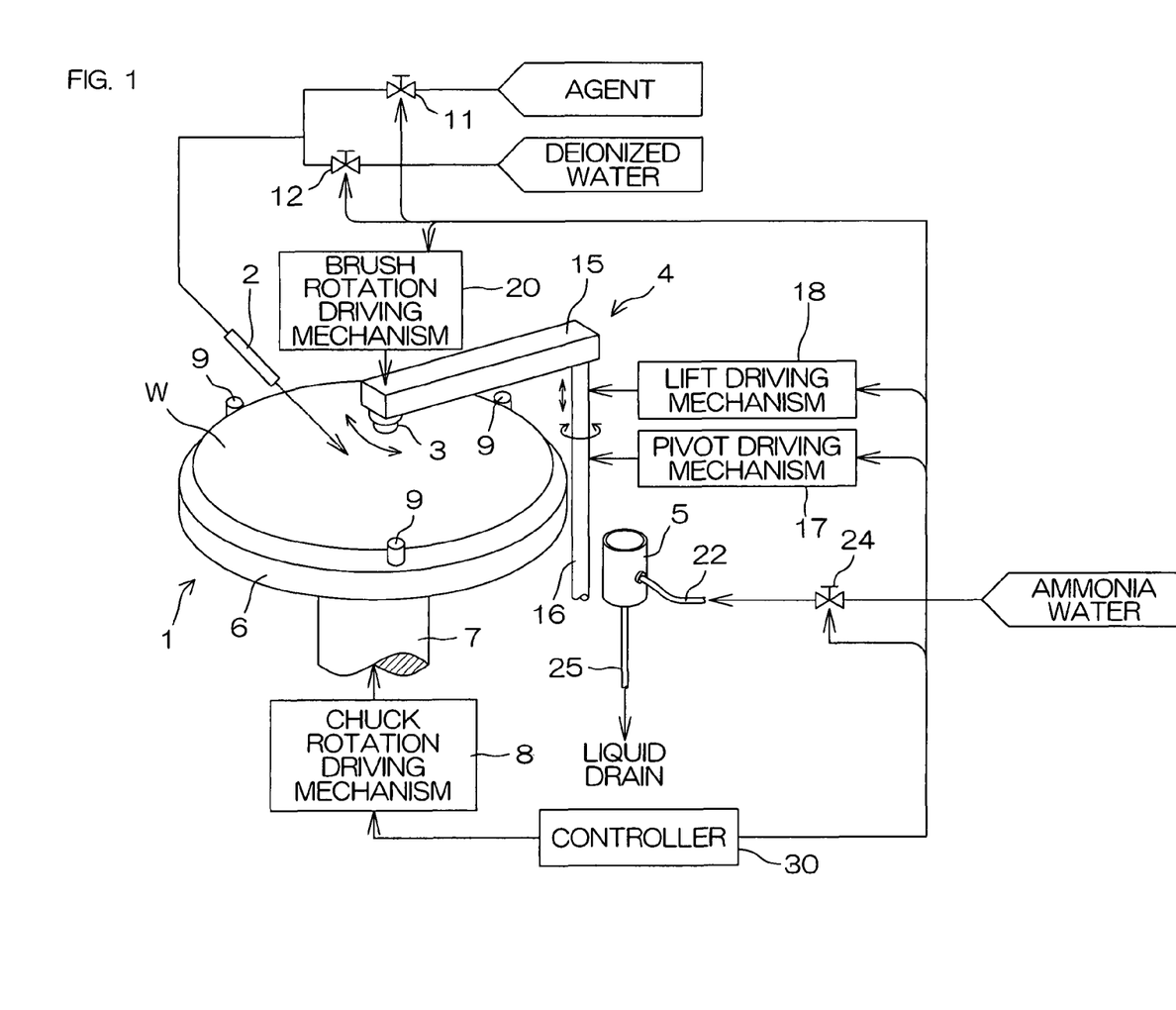
FIG. 1 is a schematic perspective view for explaining the basic construction of a substrate treatment apparatus according to a first embodiment of the present invention.

FIG. 1 is a schematic perspective view for explaining the basic construction of a substrate treatment apparatus according to a first embodiment of the present invention. The substrate treatment apparatus includes a spin chuck (substrate holding/rotating mechanism) 1 which generally horizontally holds and rotates a semiconductor wafer W (hereinafter referred to as "wafer W") as an exemplary substrate, a treatment liquid nozzle 2 which supplies a treatment liquid toward the rotation center of the wafer W held by the spin chuck 1, a scrub brush 3 for scrubbing a surface of the wafer W, a brush moving mechanism 4 for moving the scrub brush 3, and a standby pot 5 in which the scrub brush 3 is kept on standby.

The spin chuck 1 includes a disk-shaped rotation base 6, a rotation shaft 7 which generally horizontally supports the rotation base 6 and is rotatable about a vertical axis, and a chuck rotation driving mechanism 8 which applies a torque to the rotation shaft 7. A plurality of chuck pins 9 project upright from an upper surface of the rotation base 6 for holding the wafer W in contact with a peripheral surface of the wafer W. With this arrangement, the wafer W can be generally horizontally held and rotated.

A chemical agent from a chemical agent supply source and deionized water from a deionized water supply source are supplied to the treatment liquid nozzle 2 via an agent valve 11 and a deionized water valve 12, respectively. That is, the agent is supplied to the wafer W from the treatment liquid nozzle 2 by opening the agent valve 11, and the deionized water is supplied to the wafer W from the treatment liquid nozzle 2 by opening the deionized water valve 12. When the treatment liquid (the agent or the deionized water) is supplied to the rotation center of the wafer W with the spin chuck 1 being rotated, the treatment liquid spreads over the substantially entire upper surface of the wafer W by a centrifugal force to flow outward down from a peripheral edge of the wafer W.

In this embodiment, the agent to be supplied from the agent supply source is an alkaline liquid (alkaline treatment liquid). More specifically, the agent is ammonia water or an ammonia-hydrogen peroxide mixture. Any other alkaline liquid may be used as long as it does not adversely influence the wafer W. However, the ammonia water or the ammonia-hydrogen peroxide mixture which is generally usable in a semiconductor device production plant is the most preferred.

The scrub brush 3 is a sponge-like scrub member composed of, for example, PVA (polyvinyl alcohol). The brush moving mechanism 4 for moving the scrub brush 3 includes a pivot arm 15 which holds the scrub brush 3 downward at its distal end, a support shaft 16 which generally horizontally supports the pivot arm 15, a pivot driving mechanism 17 which pivots the support shaft 16 about a vertical axis, and a lift driving mechanism 18 which vertically moves the support shaft 16. With this arrangement, the scrub brush 3 is movable horizontally above the wafer W and movable vertically toward and away from the wafer W. When the pivot arm 15 is pivoted with the scrub brush 3 in contact with the surface of the wafer W during the rotation of the wafer W, the scrub brush 3 is moved from the rotation center of the wafer W to the peripheral edge of the wafer W. Thus, the entire surface of the wafer W is scanned to be scrubbed with the scrub brush 3.

The pivot arm 15 incorporates a brush rotation driving mechanism 20 for rotating the scrub brush 3 about a vertical axis.

The standby pot 5 is a tubular container which is capable of receiving the scrub brush 3. Ammonia water as an alkaline liquid (alkaline fluid) for controlling the zeta potential of the scrub brush 3 is supplied from an alkaline liquid supply pipe 22. The alkaline liquid supply pipe 22 is connected to an alkaline liquid supply source (ammonia water supply source) via an alkaline liquid valve 24. A liquid drain pipe 25 is connected to a bottom of the standby pot 5.

The operations of the chuck rotation driving mechanism 8, the pivot driving mechanism 17, the lift driving mechanism 18 and the brush rotation driving mechanism 20, and the opening and closing of the agent valve 11, the deionized water valve 12 and the alkaline liquid valve 24 are controlled by a controller 30.

Figure 2:
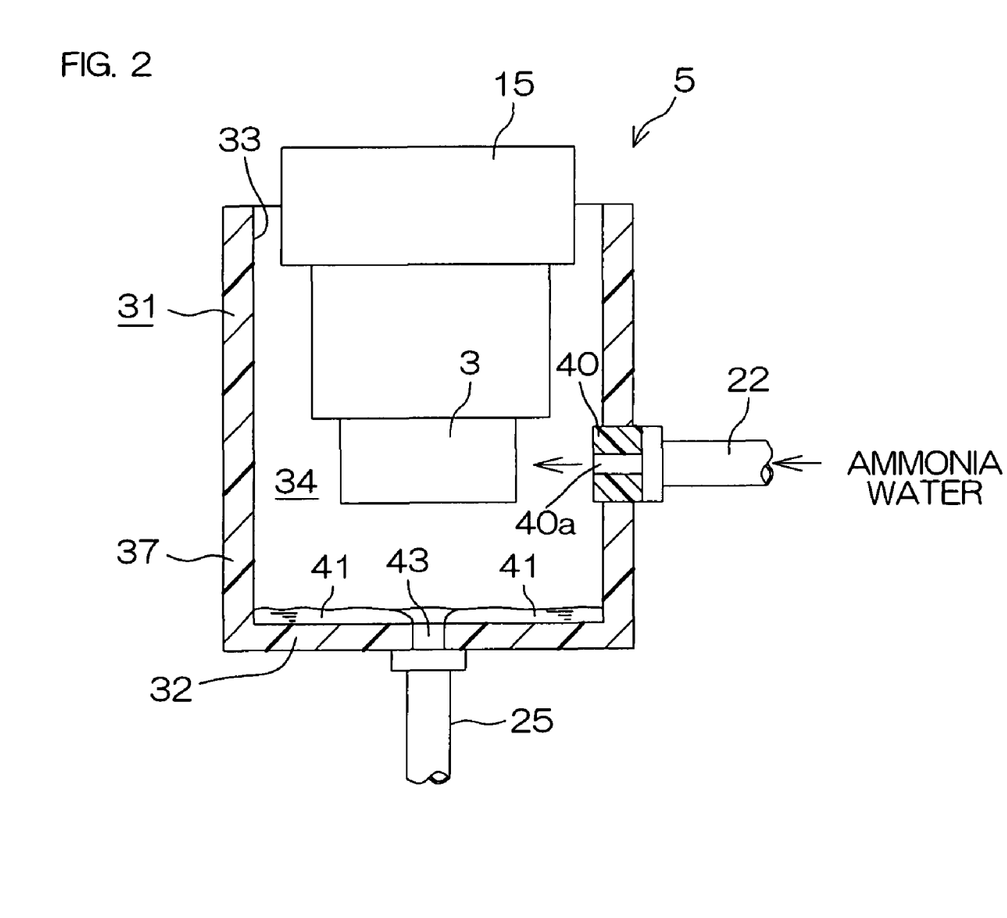
FIG. 2 is a schematic sectional view illustrating the construction of an exemplary standby pot.

FIG. 2 is a schematic sectional view illustrating an exemplary construction of the standby pot 5. The standby pot 5 includes a pot body 31. The pot body 31 is a bottomed tubular container (a bottomed hollow cylindrical container in this example) having an open top, which serves as a brush inlet 33 for receiving the scrub brush 3. The pot body 31 has a generally horizontal bottom portion 32, which functions as an alkaline liquid retaining portion for retaining the alkaline liquid. The pot body 31 has a scrub brush accommodating space 34 defined therein for accommodating the entire scrub brush 3.

The pot body 31 has a side wall 37 having an alkaline liquid port 40 connected to the alkaline liquid supply pipe 22. The alkaline liquid port 40 has a liquid outlet 40a which is to be opposed to the scrub brush 3 when the scrub brush 3 is accommodated in the pot body 31 (in a standby position), and serves as an alkaline liquid nozzle from which the alkaline liquid is discharged toward the scrub brush 3.

The alkaline liquid hits against the scrub brush 3 and flows down onto the bottom portion 32 to form an alkaline liquid film (ammonia water film) 41 on the bottom portion 32 by surface tension. The alkaline liquid film 41 has a thickness of about 2 mm, for example, to form an alkaline liquid puddle having a volume of about 3 cc to about 4 cc by the surface tension. An alkaline gas or vapor (ammonia gas) emanating from the alkaline liquid of the alkaline liquid film 41 is supplied to the scrub brush 3. Thus, an alkaline substance (ammonia) is supplied both in a liquid form and in a gaseous form to the scrub brush 3.

The pot body 31 has a liquid drain port 43 provided in the bottom portion 32 thereof and connected to the liquid drain pipe 25. The alkaline liquid (ammonia water) is introduced into the liquid drain pipe 25 from the bottom portion 32 through the liquid drain port 43.

Referring to FIGS. 1 and 2, the operation of the substrate treatment apparatus will be explained.

An untreated wafer W is loaded onto the spin chuck 1 by a substrate transport robot (not shown). When the wafer W is held by the spin chuck 1, the controller 30 controls the chuck rotation driving mechanism 8 to rotate the spin chuck 1. Thus, the wafer W is held generally horizontally and rotated about the vertical axis.

In this state, the controller 30 opens the agent valve 11 to supply the alkaline treatment liquid toward the rotation center of the wafer W from the treatment liquid nozzle 2. The alkaline treatment liquid forms a treatment liquid flow spreading over the wafer W outward from the rotation center of the wafer W by the centrifugal force.

The controller 30 controls the pivot driving mechanism 17 and the lift driving mechanism 18 to move the scrub brush 3 to a position above around the rotation center of the wafer W. Thereafter, the controller 30 controls the lift driving mechanism 18 to move down the scrub brush 3 into contact with a surface of the wafer W. In this state, the controller 30 controls the pivot driving mechanism 17 to move the scrub brush 3 from the rotation center of the wafer W to a peripheral edge of the wafer W. Thus, the surface of the wafer W is substantially entirely scanned to be scrub-cleaned.

When the scrub brush 3 reaches the peripheral edge of the wafer W, the controller 30 controls the lift driving mechanism 18 to move up the scrub brush 3 away from the surface of the wafer W. In this state, the controller 30 controls the pivot driving mechanism 17 to move the scrub brush 3 to the rotation center of the wafer W.

Thereafter, the aforesaid operation is repeated a predetermined number of times to perform a scrub-cleaning operation to scrub-clean the wafer W. Foreign matter removed from the surface of the wafer W by the scrubbing with the scrub brush 3 is washed away from the wafer W by the treatment liquid flow on the wafer W, and flows down together with the treatment liquid.

When the scrub-cleaning operation is performed, the scrub brush 3 is located in a treatment position (ranging from the rotation center of the wafer W to the peripheral edge of the wafer W).

During the scrub-cleaning operation, the scrub brush 3 is constantly kept in contact with the alkaline liquid supplied to the wafer W from the treatment liquid nozzle 2. Therefore, the surface of the scrub brush 3 is kept alkaline, for example, at a pH not lower than 9 (preferably, not lower than 10) during the scrub-cleaning operation.

After completion of the scrub-cleaning operation, the controller 30 controls the pivot driving mechanism 17 and the lift driving mechanism 18 to insert the scrub brush 3 into the standby pot 5. When the scrub brush 3 is accommodated in the standby pot 5, the scrub brush 3 is located in a standby position.

Thereafter, the controller 30 closes the agent valve 11, and then opens the deionized water valve 12. Thus, the deionized water is supplied from the treatment liquid nozzle 2 toward the rotation center of the rotating wafer W. Thus, a rinsing operation is performed to rinse the wafer W with the deionized water.

After the rinsing operation is performed for a predetermined period, the controller 30 closes the deionized water valve 12 to stop the supply of the deionized water, and controls the chuck rotation driving mechanism 8 to increase the rotation speed of the spin chuck 1 to a predetermined drying rotation speed. Thus, a drying operation is performed to spin out the water from the surface of the wafer W by a centrifugal force.

After the drying operation is performed for a predetermined period, the controller 30 controls the chuck rotation driving mechanism 8 to stop the rotation of the spin chuck 1, and releases the wafer W from the chuck pins 9. In this state, the treated wafer W is unloaded by the substrate transport robot.

The aforesaid operations are repeatedly performed to treat a plurality of wafers W.

On the other hand, the controller 30 controls the brush rotation driving mechanism 20 to rotate the scrub brush 3 in the standby period during which the scrub brush 3 is accommodated in the scrub brush accommodating space 34 of the standby pot 5, and opens the alkaline liquid valve 24 to discharge the alkaline liquid (ammonia water in this embodiment) from the liquid outlet 40a of the alkaline liquid port 40. The alkaline liquid reaches the surface of the scrub brush 3 to keep the scrub brush surface at a pH not lower than 9 (preferably not lower than 10).

The controller 30 may keep the alkaline liquid valve 24 in an opened state during the entire period in which the scrub brush 3 is accommodated in the scrub brush accommodating space 34 of the standby pot 5. Alternatively, the controller 30 may open the alkaline liquid valve 24 for a predetermined period and then close the alkaline liquid valve 24, whereby the alkaline liquid is supplied to the scrub brush 3 for a predetermined limited period to suppress the consumption of the alkaline liquid. Further, the supply of the alkaline liquid to the scrub brush 3 for the predetermined period may be repeated at predetermined time intervals to intermittently supply the alkaline liquid to the scrub brush 3.

As described above, the alkaline liquid supplied to the scrub brush 3 forms the liquid film 41 in the bottom portion 32 of the pot body 31, and the alkaline gas (ammonia gas) emanating from the liquid film 41 reaches the scrub brush 3. Thus, the surface of the scrub brush 3 can be kept at a pH not lower than 9. Therefore, after the alkaline liquid is supplied to the scrub brush 3 for a predetermined period, the surface of the scrub brush 3 can be kept at a negative zeta potential even after the supply of the alkaline liquid is stopped.

Thus, the surface portion of the scrub brush 3 located in the standby position (in the standby pot 5) is kept at a pH not lower than 9 as during the scrub-cleaning operation, so that the surface of the scrub brush 3 and foreign matter adhering to the scrub brush surface can be each kept at a negative zeta potential.

The plurality of wafers W to be treated are not necessarily continuously loaded into the substrate treatment apparatus, but the substrate treatment apparatus sometimes has a relatively long standby period (e.g., 2 to 3 hours) between batch processes. In such a standby period, the scrub brush 3 is retained in the standby position (in the standby pot 5).

When an untreated wafer W is treated after the standby period, the surface of the wafer W, the surface of the scrub brush 3 and foreign matter adhering to the scrub brush surface each have a negative surface potential. Further, the ammonia water or the ammonia-hydrogen peroxide mixture (alkaline liquid) is supplied as the agent to the surface of the wafer W, so that foreign matter on the surface of the wafer W also has a negative zeta potential. When the scrub-cleaning operation is performed in this state, the foreign matter is easily removed from the surface of the wafer W, and the removed foreign matter is less liable to adhere to the wafer W and the scrub brush 3 again. Even if foreign matter remaining on the surface of the scrub brush 3 is removed from the scrub brush 3, the foreign matter is less liable to adhere to the wafer W and the scrub brush 3 again. Of course, the accumulation of the foreign matter on the scrub brush 3 is suppressed. The foreign matter removed from the wafer W and the scrub brush 3 is washed away from the wafer W by the treatment liquid (the ammonia water or the ammonia-hydrogen peroxide mixture). Thus, the wafer W can be properly cleaned immediately after the standby period. Therefore, the scrub-cleaning operation can be advantageously performed on all the wafers W.

In the substrate treatment apparatus according to this embodiment, the alkaline substance is thus supplied to the scrub brush 3 both during the scrub-cleaning operation and in the standby period, so that the surface of the scrub brush 3 can be kept at a pH not lower than 9 (preferably not lower than 10). Thus, the surface of the scrub brush 3 and the foreign matter adhering to the scrub brush surface can be each constantly kept at a negative zeta potential, so that the scrub-cleaning operation can be properly evenly performed on the plurality of wafers W.

Figure 3:
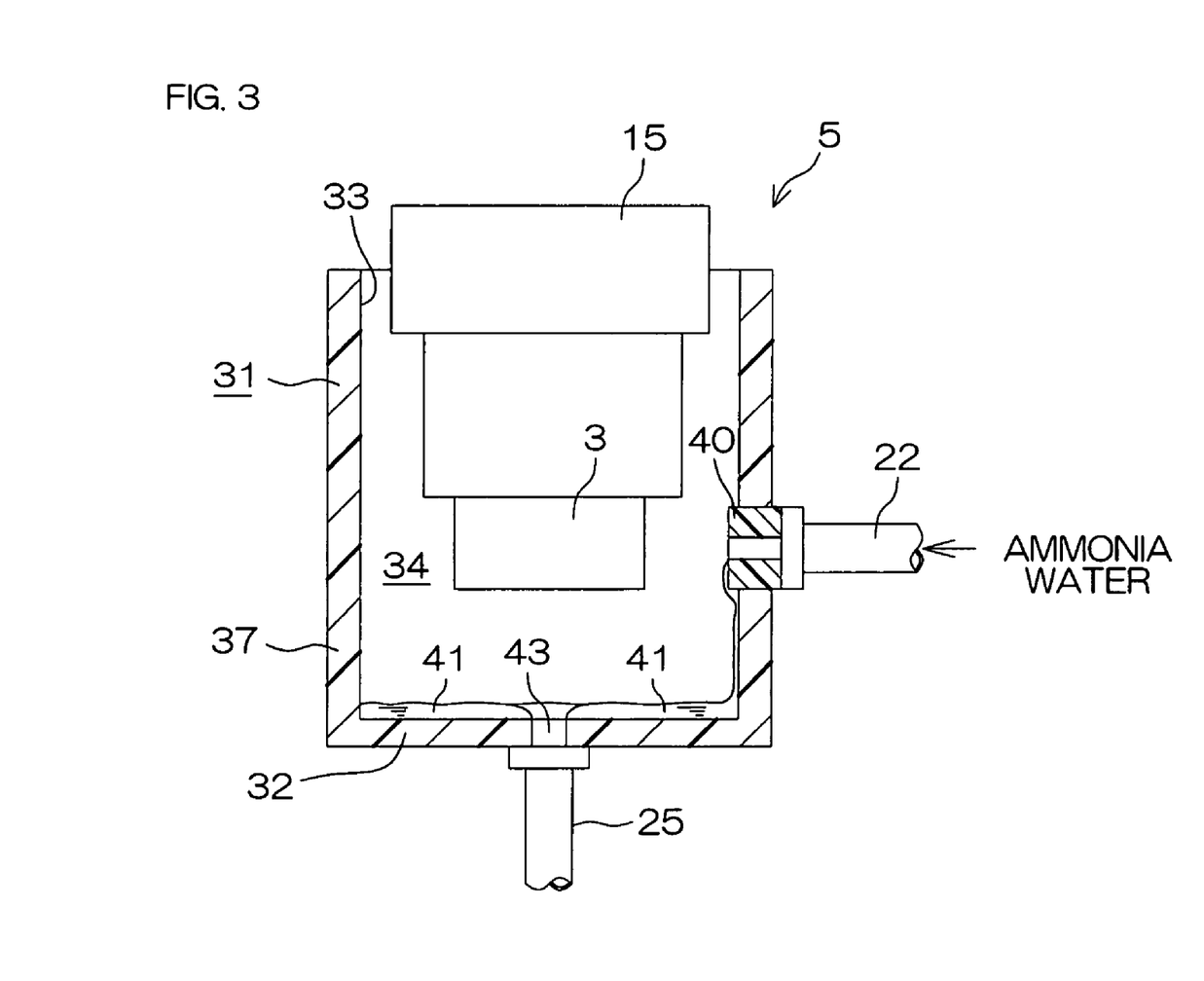
FIG. 3 is a schematic sectional view illustrating the construction of a standby pot according to a second embodiment of the present invention.

FIG. 3 is a schematic sectional view for explaining a second embodiment of the present invention, illustrating another exemplary construction of the standby pot 5 provided in the apparatus shown in FIG. 1. In FIG. 3, components corresponding to those shown in FIG. 2 will be denoted by the same reference characters as in FIG. 2.

In this embodiment, the ammonia water (alkaline liquid) is introduced at a lower flow rate into the standby pot 5 from the alkaline liquid port 40 (by so-called slow leak). The introduced ammonia water flows along the interior wall of the pot body 31 to reach the bottom portion 32 (alkaline liquid retaining portion), whereby the alkaline liquid film (ammonia water film) 41 is formed on the upper surface of the bottom portion 32 by the surface tension.

The alkaline gas or vapor (ammonia gas), which emanates from the alkaline liquid of the alkaline liquid film 41, is supplied to the scrub brush 3. Where only the alkaline vapor is supplied to the scrub brush 3, the amount of metal impurities is reduced as compared with a case where the alkaline liquid is supplied to the scrub brush 3. Therefore, the contamination of the scrub brush 3 with the metal impurities is effectively suppressed. Further, the concentration of the alkaline substance in the alkaline liquid film 41 can be kept at a predetermined concentration level, because the alkaline liquid diluted by the emanation of the alkaline gas is replaced with the alkaline liquid newly supplied from the alkaline liquid port 40.

In this case, the controller 30 constantly opens the alkaline liquid valve 24 during the operation of the substrate treatment apparatus. Therefore, the alkaline liquid film 41 is constantly formed on the bottom portion 32 (alkaline liquid retaining portion) of the standby pot 5, so that the pot body 31 is constantly filled with the alkaline gas by the emanation of the alkaline gas (ammonia gas in this embodiment) from the alkaline liquid film 41. Thus, the surface portion of the scrub brush 3 located in the standby position (in the standby pot 5) is kept at a pH not lower than 9 (preferably not lower than 10), so that the surface of the scrub brush 3 and the foreign matter adhering to the scrub brush surface are each kept at a negative zeta potential.

In this embodiment, the alkaline substance is thus supplied in a gaseous form to the scrub brush 3 in the standby position. Therefore, the consumption of the alkaline liquid can be reduced.

Figure 4:
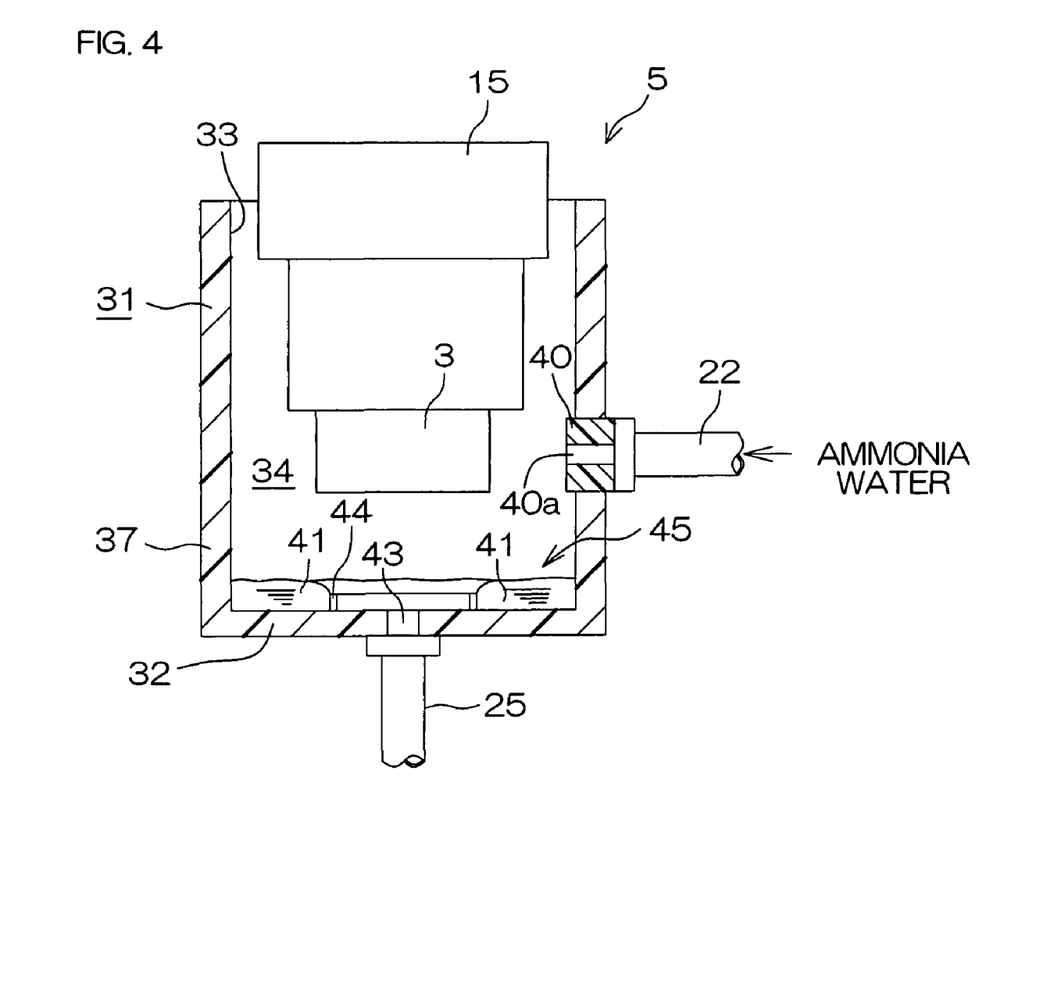
FIG. 4 is a schematic sectional view illustrating the construction of a standby pot according to a third embodiment of the present invention.

FIG. 4 is a schematic sectional view for explaining a third embodiment of the present invention, illustrating further another exemplary construction of the standby pot 5 provided in the apparatus shown in FIG. 1. In FIG. 4, components corresponding to those shown in FIG. 2 will be denoted by the same reference characters as in FIG. 2.

In this embodiment, a tubular weir member (e.g., a hollow cylindrical weir member) 44 is provided around the liquid drain port 43 as projecting upright inwardly of the bottom portion 32. An alkaline liquid retaining portion 45 for retaining the alkaline liquid is defined between an interior surface of the side wall 37 of the pot body 31 and an outer peripheral surface of the weir member 44.

The alkaline liquid discharged from the liquid outlet 40a of the alkaline liquid port 40 is supplied to the surface of the scrub brush 3, and then flows down to be retained in the alkaline liquid retaining portion 45 to form a relatively thick liquid film 41. The alkaline gas, which emanates from the alkaline liquid retained in the alkaline liquid retaining portion 45 to reach the scrub brush accommodating space 34 above the alkaline liquid retaining portion 45, is supplied to the scrub brush 3 located in the standby position. Thus, the alkaline substance can be supplied both in a liquid form and in a gaseous form to the scrub brush 3. In this embodiment, a relatively great amount of the alkaline liquid can be retained in the alkaline liquid retaining portion 45, so that the alkaline gas can be stably supplied to the scrub brush 3.

This embodiment may be modified as in the second embodiment, so that the alkaline liquid is supplied at a very low flow rate from the alkaline liquid port 40 (by the so-called slow leak). In this case, the alkaline liquid is not directly applied to the scrub brush 3, but retained in the alkaline liquid retaining portion 45 to form the relatively thick liquid film 41. Then, the alkaline gas emanating from the alkaline liquid of the liquid film 41 is supplied to the scrub brush 3, whereby the surface of the scrub brush 3 is kept at a pH not lower than 9 (preferably not lower than 10).

In this case, the alkaline liquid valve 24 provided in the alkaline liquid supply pipe 22 connected to the alkaline liquid port 40 is constantly kept in an opened state by the controller 30 (see FIG. 1) during the operation of the substrate treatment apparatus. Thus, the alkaline liquid is constantly supplied at the low flow rate to the alkaline liquid retaining portion 45 from the alkaline liquid port 40 (by the so-called slow leak). Therefore, the alkaline liquid retained in the alkaline liquid retaining portion 45 flows over the weir member 44 to be discharged from the liquid drain port 43. Thus, the alkaline liquid in the alkaline liquid retaining portion 45 is replaced with the newly supplied alkaline liquid, so that the dilution of the alkaline liquid due to the emanation of the alkaline gas can be suppressed. Therefore, the alkaline gas can be constantly emitted.

Figure 5:
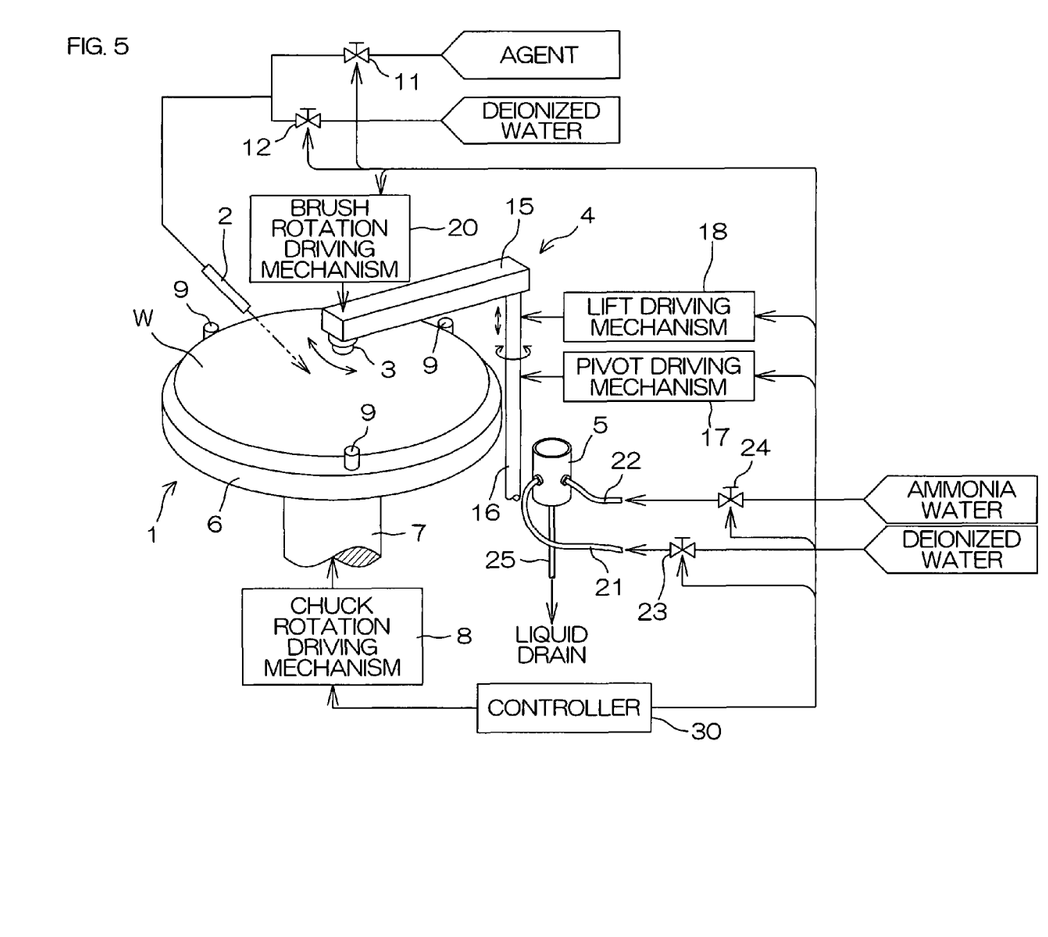
FIG. 5 is a schematic perspective view for explaining the basic construction of a substrate treatment apparatus according to a fourth embodiment of the present invention.

FIG. 5 is a schematic perspective view for explaining the basic construction of a substrate treatment apparatus according to a fourth embodiment of the present invention. In FIG. 5, components corresponding to those shown in FIG. 1 will be denoted by the same reference characters as in FIG. 1.

In this embodiment, deionized water (cleaning liquid) for cleaning the scrub brush 3 is supplied to the standby pot 5 from a cleaning liquid supply pipe 21, and the ammonia water (alkaline liquid) for controlling the zeta potential of the scrub brush 3 is supplied from the alkaline liquid supply pipe 22 to the standby pot 5. The cleaning liquid supply pipe 21 is connected to a cleaning liquid supply source (deionized water supply source) via a cleaning liquid valve 23. The opening and closing of the cleaning valve 23 is controlled by the controller 30.

Figure 6:
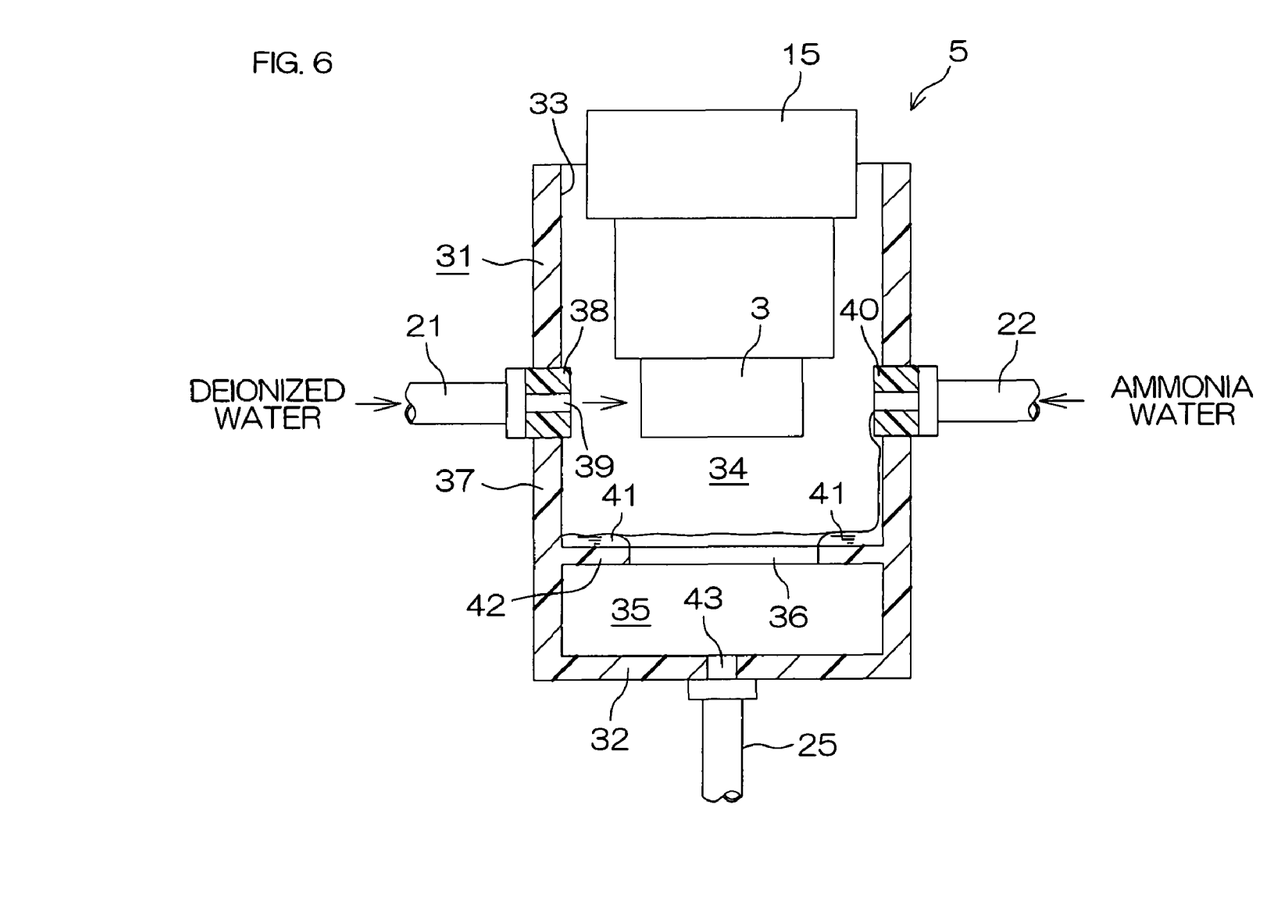
FIG. 6 is a schematic sectional view illustrating the construction of an exemplary standby pot which is applicable to the fourth embodiment.

FIG. 6 is a schematic sectional view illustrating the construction of the standby pot 5 according to this embodiment. The standby pot 5 includes a pot body 31, and an alkaline liquid retaining portion 42 provided in the pot body 31. The pot body 31 is a bottomed tubular container (a bottomed hollow cylindrical container in this example) having an open top, which serves as a brush inlet 33 for receiving the scrub brush 3. The alkaline liquid retaining portion 42 is a plate member disposed generally horizontally at a middle height level in the pot body 31. A space above the alkaline liquid retaining portion 42 in the pot body 31 is defined as a scrub brush accommodating space 34 for accommodating the entire scrub brush 3. A space below the alkaline liquid retaining portion 42 in the pot body 31 is defined as a liquid draining portion 35.

The alkaline liquid retaining portion 42 has an opening 36 provided in a center portion thereof to be opposed to a lower surface of the scrub brush 3. That is, the alkaline liquid retaining portion 42 is an annular plate member. The scrub brush accommodating space 34 and the liquid drain portion 35 respectively disposed above and below the alkaline liquid retaining portion 42 communicate with each other via the opening 36.

The pot body 31 has a cleaning liquid port 38 provided in a side wall 37 thereof at a higher level than the alkaline liquid retaining portion 42 and connected to the cleaning liquid supply pipe 21. The cleaning liquid port 38 has a liquid outlet 39 which is to be opposed to the scrub brush 3 when the scrub brush 3 is accommodated in the pot body 31 (in a standby position), and serves as a cleaning liquid nozzle from which the deionized water (cleaning liquid) is discharged toward the scrub brush 3.

The pot body 31 further has an alkaline liquid port 40 provided in the side wall 37 thereof at a higher level than the alkaline liquid retaining portion 42 and connected to the alkaline liquid supply pipe 22. The ammonia water (alkaline liquid) is introduced at a lower flow rate from the alkaline liquid port 40 (by so-called slow leak). The introduced ammonia water flows down along an interior wall of the pot body 31 to reach the alkaline liquid retaining portion 42 to form an alkaline liquid film (ammonia water film) 41 on an upper surface of the alkaline liquid retaining portion 42 by surface tension. The alkaline liquid film 41 has a thickness of about 2 mm, for example, to form an alkaline liquid puddle having a volume of about 3 cc to about 4 cc on the alkaline liquid retaining portion 42 by the surface tension. An alkaline gas or vapor (ammonia gas), which emanates from the alkaline liquid of the alkaline liquid film 41, is supplied to the scrub brush 3. Where only the alkaline vapor is supplied to the scrub brush 3, the amount of metal impurities is reduced as compared with a case where the alkaline liquid is supplied to the scrub brush 3. Therefore, the contamination of the scrub brush 3 with the metal impurities is effectively suppressed. Further, the concentration of the alkaline substance in the alkaline liquid film 41 is kept at a predetermined concentration level, because the alkaline liquid diluted by the emanation of the alkaline gas is replaced with the alkaline liquid newly supplied from the alkaline liquid port 40.

When the deionized water (cleaning liquid) is discharged from the liquid outlet 39 of the cleaning liquid port 38 toward the scrub brush 3, the cleaning liquid may scatter into the alkaline liquid film 41 to dilute the alkaline liquid of the alkaline liquid film 41. Even in this case, the alkaline liquid is newly supplied from the alkaline liquid port 40 to the alkaline liquid film 41 by the slow leak, so that the concentration of the alkaline substance in the alkaline liquid film 41 is restored to the predetermined concentration level. Thus, the ammonia gas can be assuredly supplied to the scrub brush 3.

The opening 36 preferably has a size greater than the area of the lower surface of the scrub brush 3. This suppresses the intrusion of the deionized water into the ammonia water film 41 on the alkaline liquid retaining portion 42 and the dilution of the ammonia water which may otherwise occur when the deionized water discharged from the liquid outlet 39 of the cleaning liquid port 38 scatters from the scrub brush 3.

The pot body 31 has a liquid drain port 43 provided in a bottom portion (bottom plate) 32 thereof and connected to a liquid drain pipe 25. The liquids introduced into the liquid drain portion 35 are introduced into the liquid drain pipe 25 through the liquid drain port 43. The cleaning liquid discharged from the cleaning liquid port 38 and the alkaline liquid (ammonia water) of the alkaline liquid film 41 flow down into the liquid drain portion 35 through the opening 36, and then drained into the liquid drain pipe 25 from the liquid drain port 43.

The substrate treatment apparatus operates in substantially the same manner as in the first embodiment, but an operation associated with the standby pot 5 is different. The difference will hereinafter be described.

The controller 30 constantly opens the alkaline liquid valve 24 during the operation of the substrate treatment apparatus. Thus, the alkaline liquid film 41 is constantly formed on the alkaline liquid retaining portion 42 in the standby pot 5. Further, the inside of the pot body 31 is filled with the alkaline gas (ammonia gas in this embodiment) emanating from the alkaline liquid film 41. Thus, the surface portion of the scrub brush 3 located in the standby position (in the standby pot 5) is kept at a pH not lower than 9, whereby the surface of the scrub brush 3 and the foreign matter adhering to the scrub brush surface are each kept at a negative zeta potential.

As described above, the substrate treatment apparatus sometimes has a relatively long standby period (e.g., 2 to 3 hours) between batch processes. In such a standby period, the scrub brush 3 is retained in the standby position (in the standby pot 5).

If no untreated wafer W is loaded in the substrate treatment apparatus for a predetermined period (e.g., 30 minutes) or longer, the controller 30 opens the cleaning liquid valve 23 for a predetermined period. Thus, the deionized water (cleaning liquid) is discharged from the liquid outlet 39 of the cleaning liquid port 38 toward the scrub brush 3 located in the pot body 31. Thus, the foreign matter adhering to the scrub brush 3 is washed away by the deionized water, then flows down into the liquid drain portion 35 through the opening 36, and introduced into the liquid drain pipe 25 through the liquid drain port 43. In this manner, a scrub brush rinsing operation is performed to rinse the scrub brush 3 with the deionized water in the standby period.

During the scrub brush rinsing operation, the controller 30 may control the brush rotation driving mechanism 20 to rotate the scrub brush 3. Thus, the foreign matter adhering to the scrub brush 3 can be more efficiently removed.

The scrub brush 3 is swelled with the deionized water by the scrub brush rinsing operation. When the swelled scrub brush 3 is retained in the pot body 31 and the alkaline gas (ammonia gas in this embodiment) is supplied from the alkaline liquid film 41, the surface portion of the scrub brush 3 is, as a result, rapidly swelled with an alkaline aqueous solution (ammonia water in this embodiment). That is, the alkaline gas is absorbed in the deionized water in the scrub brush 3, so that the pH of the surface portion of the scrub brush 3 is rapidly increased. Thus, the zeta potential of the surface of the scrub brush 3 and the zeta potential of the foreign matter remaining on the scrub brush surface are each controlled to be negative.

According to an experiment conducted with the use of litmus paper by the inventor of the present invention, the pH of the surface of the scrub brush 3 was about 7 immediately after the rinsing with the deionized water, but increased to about 11 in about 10 seconds. Therefore, the pH of the surface of the scrub brush 3 is sufficiently increased by retaining the scrub brush 3 in the standby position for at least about 10 seconds when no untreated wafer W is loaded for a relatively long period (e.g., 30 minutes or longer) as well as when the untreated wafers W are sequentially loaded.

When an untreated wafer W is treated after the standby period, the surface of the wafer W, the surface of the scrub brush 3 and foreign matter adhering to the scrub brush surface each have a negative surface potential. Further, the ammonia water or the ammonia-hydrogen peroxide mixture (alkaline liquid) is supplied as the agent to the surface of the wafer W, so that foreign matter on the wafer surface also has a negative zeta potential. When the scrub-cleaning operation is performed in this state, the foreign matter on the surface of the wafer W is easily removed, and the removed foreign matter is less liable to adhere to the wafer W and the scrub brush 3 again. Further, even if foreign matter remaining on the surface of the scrub brush 3 is removed from the scrub brush 3, the removed foreign matter is less liable to adhere to the wafer W or the scrub brush 3 again. Of course, the accumulation of the foreign matter in the scrub brush 3 is suppressed. The foreign matter removed from the wafer W and the scrub brush 3 is washed away by the treatment liquid (the ammonia water or the ammonia-hydrogen peroxide mixture), and flows outside the wafer W. Thus, the wafer W can be properly cleaned immediately after the standby period, so that the scrub-cleaning operation is advantageously performed on all the wafers W.

Not the alkaline liquid but the alkaline gas emanating from the alkaline liquid is supplied to the scrub brush 3, so that the consumption of the alkaline liquid is reduced. Thus, the performance of the scrub-cleaning operation can be improved without significantly increasing the running costs.

Figure 7:
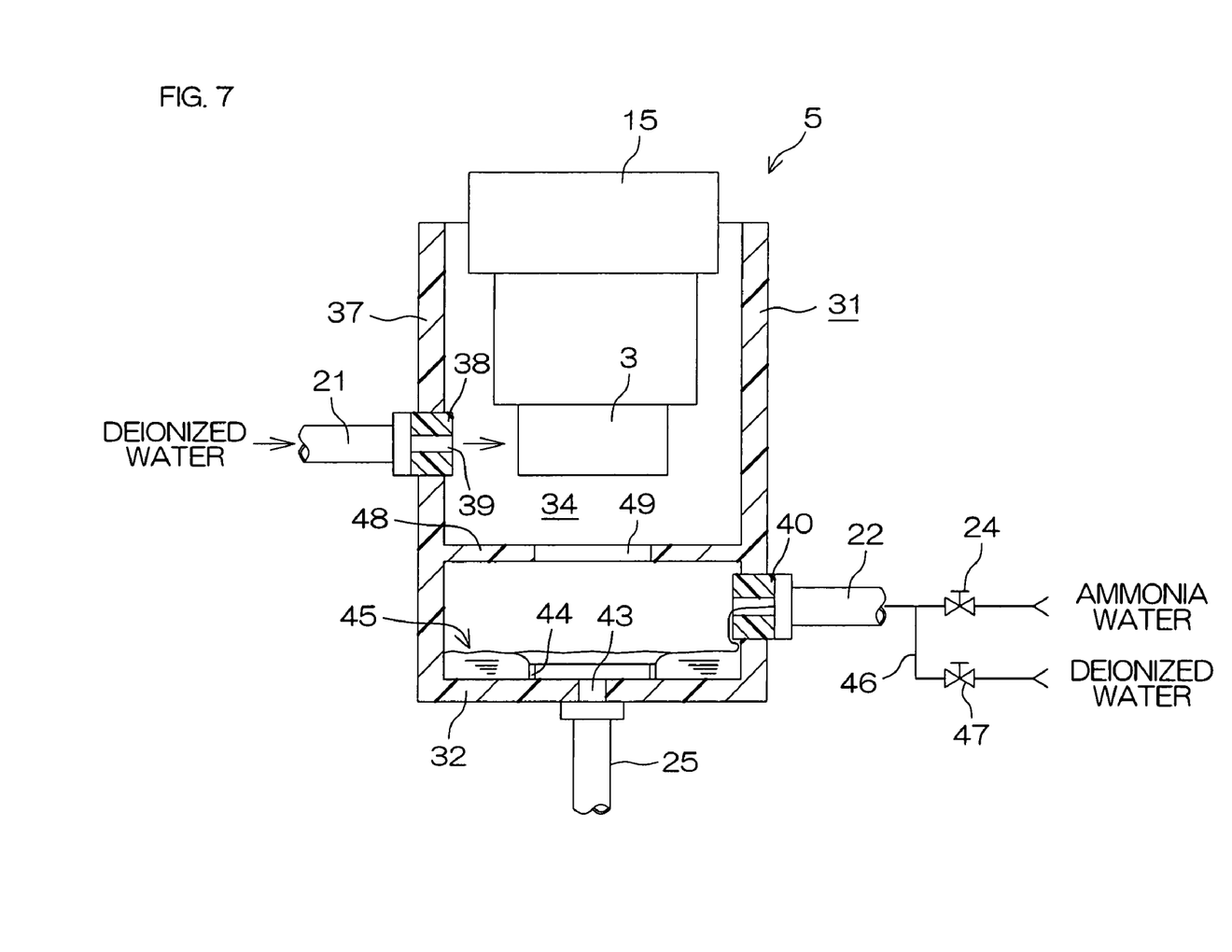
FIG. 7 is a schematic sectional view illustrating the construction of another exemplary standby pot which is applicable to the fourth embodiment.

FIG. 7 is a schematic sectional view illustrating another exemplary construction of the standby pot 5 which is applicable to the fourth embodiment. In FIG. 7, components corresponding to those shown in FIG. 6 will be denoted by the same reference characters as in FIG. 6.

In this exemplary construction, a tubular weir member (e.g., a hollow cylindrical weir member) 44 is provided around the liquid drain port 43 as projecting upright inwardly of the bottom portion 32 of the standby pot 5. An alkaline liquid retaining portion 45 for retaining the alkaline liquid is defined between an outer peripheral surface of the weir member 44 and an interior surface of the side wall 37 of the pot body 31. That is, the alkaline liquid retaining portion 45 has an annular shape surrounding the liquid drain port 43. The alkaline liquid port 40 for supplying the alkaline liquid to the alkaline liquid retaining portion 45 is provided in the side wall 37, and connected to the alkaline liquid supply pipe 22.

A liquid receiving portion 48 is disposed above the alkaline liquid retaining portion 45. The liquid receiving portion 48 is an annular plate member having an opening 49 provided in a center portion thereof to be opposed to a lower surface of the scrub brush 3 located in the standby position. The liquid receiving member 48 is generally horizontally disposed at a lower level than the cleaning liquid port 38 between the alkaline liquid retaining portion 45 and the scrub brush 3 located in the standby position.

The liquid receiving member 48 substantially entirely covers an upper surface of the alkaline liquid retaining portion 45 as seen in plan. With this arrangement, the intrusion of the deionized water into the alkaline liquid retaining portion 45 is suppressed or prevented which may otherwise occur when the deionized water (cleaning liquid) is discharged from the liquid outlet 39 of the cleaning liquid port 38 toward the scrub brush 3. Thus, the dilution of the alkaline liquid retained in the alkaline liquid retaining portion 45 can be suppressed or prevented.

The cleaning liquid supplied toward the scrub brush 3 and flowing down is introduced into the liquid drain port 43 through the opening 49 of the liquid receiving member 48, and then drained.

On the other hand, an alkaline gas emanating from the alkaline liquid retained in the alkaline liquid retaining portion 45 reaches the scrub brush accommodating space 34 through the opening 49, and is supplied to the scrub brush 3 located in the standby position.

The alkaline liquid port 40 is disposed at a height level between the liquid receiving member 48 and the alkaline liquid retaining portion 45. The alkaline liquid valve 24 provided in the alkaline liquid supply pipe 22 connected to the alkaline liquid port 40 is constantly kept in an opened state by the controller 30 (see FIG. 5) during the operation of the substrate treatment apparatus. Thus, the alkaline liquid is constantly supplied at a lower flow rate from the alkaline liquid port 40 to the alkaline liquid retaining portion 45 (by so-called slow leak). Therefore, the alkaline liquid retained in the alkaline liquid retaining portion 45 flows over the weir member 44, and drained into the liquid drain port 43. Thus, the alkaline liquid in the alkaline liquid retaining portion 45 is replaced with the newly supplied alkaline liquid, so that the dilution of the alkaline liquid due to the emanation of the alkaline gas can be suppressed. Therefore, the alkaline gas can be constantly emitted.

A deionized water supply pipe 46 for supplying deionized water from a deionized water supply source is also connected to the alkaline liquid supply pipe 22, and a deionized water valve 47 to be controlled by the controller 30 is provided in the deionized water supply pipe 46. The deionized water valve 47 is opened when the ammonia water retained in the alkaline liquid retaining portion 45 is to be replaced with the deionized water for maintenance or the like.

Figure 8:
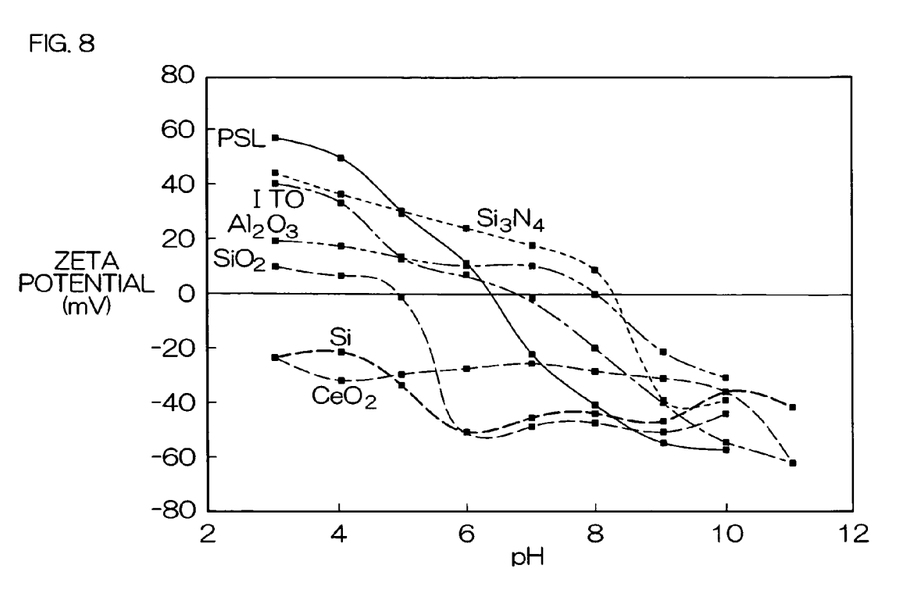
FIG. 8 is a diagram illustrating relationships between the pH and the zeta potential determined for a variety of substances supposedly present in a semiconductor process.

FIG. 8 is a diagram illustrating relationships between the pH and the zeta potential determined for a variety of substances supposedly present in a semiconductor process. As can be seen from this figure, the zeta potential can be assuredly kept at a negative level when the pH is not lower than 9. Therefore, it is expected that a silicon wafer (a typical example of the semiconductor wafer) can repel foreign matter present on the surface of the wafer.

Figure 9:
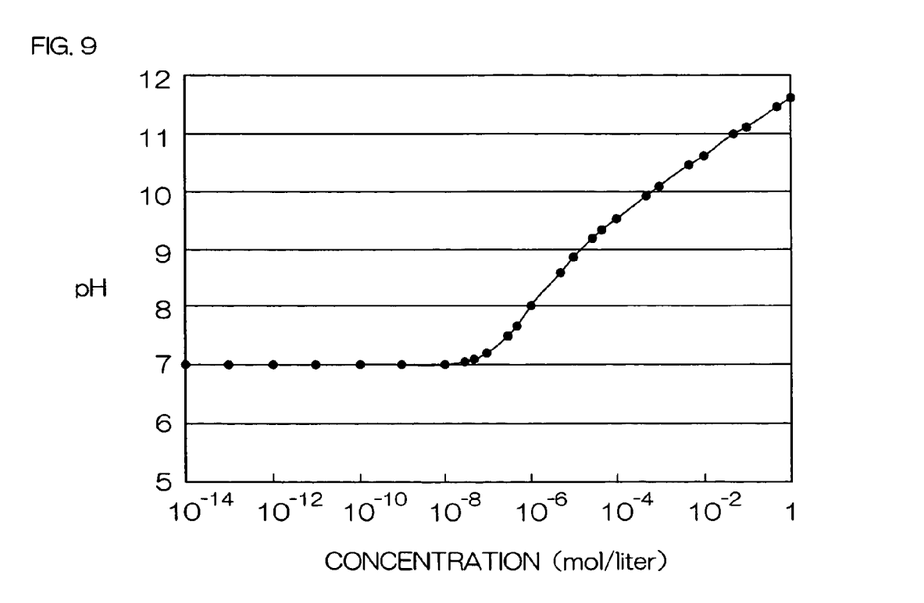
FIG. 9 is a diagram illustrating a relationship between the pH and the concentration of ammonia water as an example of an alkaline liquid.

FIG. 9 is a diagram illustrating a relationship between the pH and the concentration of ammonia in ammonia water as an example of the alkaline liquid. As can be seen from this figure, even ammonia water containing ammonia and water in a ratio of 1:1000 has a pH of about 10, so that the ammonia water is sufficiently effective for controlling the zeta potentials of the scrub brush and the foreign matter adhering to the surface of the scrub brush.

While several embodiments of the present invention have thus been described, the invention may be embodies in any other ways. In the second embodiment, the modification of the third embodiment and the fourth embodiment, the alkaline liquid is constantly supplied to the alkaline liquid retaining portion by the slow leak during the operation of the substrate treatment apparatus. Alternatively, the alkaline liquid may be supplied to the alkaline liquid retaining portion only when the standby period is not shorter than a predetermined period.

In the embodiments described above, the alkaline gas emanating from the alkaline liquid is supplied to the scrub brush 3, but the supply of the alkaline substance in the gaseous form to the scrub brush 3 may be achieved by supplying the alkaline gas from an alkaline gas supply source (a gas tank or the like) to the scrub brush 3 in the standby position.

Where an alkaline liquid such as ammonia water having sufficient volatility is used, the supply of the alkaline gas can be achieved without problems. However, where an alkaline liquid having insufficient volatility is used, a heating mechanism (a heater or the like) for heating the alkaline liquid retained in the alkaline liquid retaining portion, for example, may be provided to the standby pot 5 for promoting the emanation of the alkaline gas from the alkaline liquid.

In the embodiments described above, the ammonia water is used as the alkaline liquid to be introduced from the alkaline liquid port 40, but the alkaline liquid is not limited to the ammonia water. The alkaline liquid may be an aqueous solution containing at least one of $NH_4^+$, $RNH_3^+$, $R_2NH_2^+$, $R_3NH^+$ and $R_4N^+$ ions.

In the embodiments described above, the ammonia water or the ammonia-hydrogen peroxide mixture is used as the alkaline treatment liquid to be supplied from the treatment liquid nozzle 2 to the wafer W, but the alkaline treatment liquid is not limited to the ammonia water and the ammonia-hydrogen peroxide mixture. The alkaline treatment liquid may be an aqueous solution containing at least one of $NH_4^+$, $RNH_3^+$, $R_2NH_2^+$, $R_3NH^+$ and $R_4N^+$ ions.

In the embodiments described above, the alkaline fluid is supplied to the surface of the scrub brush 3 from the outside of the scrub brush 3 in the standby pot 5, but the supply of the alkaline fluid to the scrub brush 3 may be achieved by inserting an alkaline liquid nozzle into the scrub brush 3 with an outlet port of the nozzle located inside the scrub brush 3 and exuding the alkaline liquid from the inside of the scrub brush 3. This arrangement may double as the treatment liquid supplying mechanism for supplying the alkaline treatment liquid onto the wafer W during the scrub-cleaning operation. In this case, the alkaline liquid is supplied to the scrub brush 3 in the same manner both during the scrub-cleaning operation and in the standby period. Therefore, the state of the surface of the scrub brush 3 can be kept generally constant.

In the embodiments described above, the substrate treatment apparatus is adapted to scrub the wafer W with the scrub brush 3 while holding and rotating the wafer W by way of example. However, the present invention is also applicable to a substrate treatment apparatus which is adapted to scrub the wafer with the scrub brush (e.g., a roll-shaped scrub brush) while holding the wafer in a non-rotating state.

In the embodiments describe above, the substrate treatment apparatus is adapted to treat the semiconductor wafer by way of example. However, the present invention is also applicable to apparatuses for treating any other types of substrates such as glass substrates for liquid crystal display devices and the like.

In the fourth embodiment, the rinsing operation is performed to rinse the scrub brush 3 with the deionized water in the standby pot 5, but the rinsing operation is not necessarily required. However, the rinsing operation is preferably performed in order to reduce the amount of the foreign matter on the surface of the scrub brush 3 as much as possible and prevent the scrub brush 3 from being dried in the standby period.

In the fourth embodiment, the deionized water is used as the cleaning liquid to be discharged from the liquid outlet 39, but the cleaning liquid is not limited to the deionized water. At least one of reductive water (hydrogen water) and ion water (particularly, ionized alkaline water) may be used as the cleaning liquid. Particularly, where the reductive water (hydrogen water) or the ionized alkaline water is used as the cleaning liquid, the pH of the surface of the scrub brush 3 can be increased. Therefore, the zeta potential of the scrub brush 3 and the zeta potential of the foreign matter slightly remaining on the scrub brush surface can be each assuredly controlled to be negative.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2005-099367 and Japanese Patent Application No. 2005-099368 filed with the Japanese Patent Office on Mar. 30, 2005, the disclosure of which is incorporated herein by reference.

What is claimed is:

1. A substrate treatment apparatus comprising:
a substrate holding mechanism which holds a substrate;
a scrub brush for scrubbing a surface of the substrate held by the substrate holding mechanism to remove foreign matter from the substrate surface;
an alkaline gas supplying mechanism which supplies an alkaline gas to a surface of the scrub brush in a standby period during which no substrate is scrubbed with the scrub brush;
a brush moving mechanism which moves the scrub brush between a treatment position in which the substrate surface is scrubbed and a standby position to which the scrub brush is retracted from the treatment position; and
a standby pot arranged to receive the scrub brush at the standby position, the standby pot including a pot body in a form of a bottomed tubular container having a side wall, wherein
the alkaline gas supplying mechanism supplies the alkaline gas to the scrub brush when the scrub brush is located in the standby position, the alkaline gas supplying mechanism includes an alkaline liquid retaining portion provided below the standby position for retaining a volatile alkaline liquid from which the alkaline gas is liberated, the alkaline liquid retaining portion includes a plate member projecting inwardly from an interior surface of the side wall and having an opening penetrating therethrough, and the alkaline gas supplying mechanism further includes an alkaline liquid supplying nozzle for supplying an alkaline liquid to the alkaline liquid retaining portion, the alkaline liquid supplying nozzle arranged on the side wall of the pot body above the plate member such that the alkaline liquid supplied by the alkaline liquid supply nozzle flows down along the interior surface of the side wall of the pot body.

2. A substrate treatment apparatus as set forth in claim 1, further comprising a treatment liquid supplying mechanism which supplies a treatment liquid to the substrate surface when the substrate is scrubbed with the scrub brush.

3. A substrate treatment apparatus as set forth in claim 1, further comprising a cleaning liquid supplying mechanism which supplies a cleaning liquid to the scrub brush located in the standby position.

4. A substrate treatment apparatus as set forth in claim 3, wherein the cleaning liquid is deionized water.

5. A substrate treatment apparatus, comprising:
a substrate holding mechanism which holds a substrate;
a scrub brush for scrubbing a surface of the substrate held by the substrate holding mechanism to remove foreign matter from the substrate surface;
an alkaline gas supplying mechanism which supplies an alkaline gas to a surface of the scrub brush in a standby period during which no substrate is scrubbed with the scrub brush;
a brush moving mechanism which moves the scrub brush between a treatment position in which the substrate surface is scrubbed and a standby position to which the scrub brush is retracted from the treatment position; and
a standby pot having a pot body in a form of a bottomed tubular container arranged to receive the scrub brush at the standby position, the pot body having a side wall, wherein
the alkaline gas supplying mechanism supplies the alkaline gas to the scrub brush when the scrub brush is located in the standby position,
the alkaline gas supplying mechanism includes an alkaline liquid retaining portion provided below the standby position for retaining a volatile alkaline liquid from which the alkaline gas is liberated,
the substrate treatment apparatus further comprises a liquid receiving member provided above the alkaline liquid retaining portion for suppressing or preventing intrusion of any other liquid into the alkaline liquid retaining portion, and
the liquid receiving member includes a plate member projecting inwardly from an interior surface of the side wall and having an opening penetrating therethrough.

6. A substrate treatment apparatus as set forth in claim 5, further comprising a standby pot arranged to receive the scrub brush at the standby position, wherein
the alkaline gas supplying mechanism further includes an alkaline liquid supplying nozzle for supplying an alkaline liquid into the alkaline liquid retaining portion, and
the alkaline liquid retaining portion is arranged within the standby pot and away from the alkaline liquid supplying nozzle.

7. A substrate treatment apparatus as set forth in claim 5, further comprising a cleaning liquid supply nozzle, arranged above the liquid receiving member, for supplying a cleaning liquid to the scrub brush located in the standby position, wherein
the alkaline gas supplying mechanism further includes an alkaline liquid supplying nozzle, arranged below the liquid receiving member, for supplying an alkaline liquid to the alkaline liquid retaining portion.

8. A substrate treatment apparatus as set forth in claim 5, wherein the pot body further has a bottom portion, and a liquid drain port provided in the bottom portion, and
the alkaline liquid retaining portion includes a weir member provided around the drain port as projecting from the bottom portion and arranged to define the alkaline liquid retaining portion between an outer surface of the weir member and interior surface of the side wall.

9. A substrate treatment apparatus, comprising:
a substrate holding mechanism which holds a substrate;
a scrub brush for scrubbing a surface of the substrate held by the substrate holding mechanism to remove foreign matter from the substrate surface;
a brush moving mechanism which moves the scrub brush between a treatment position in which the substrate surface is scrubbed and a standby position to which the scrub brush is retracted from the treatment position;
a standby pot arranged to receive the scrub brush at the standby position;
an alkaline gas supplying mechanism which supplies an alkaline gas to a surface of the scrub brush in a standby period during which no substrate is scrubbed with the scrub brush; wherein
the alkaline gas supplying mechanism supplies the alkaline gas to the scrub brush when the scrub brush is located in the standby position; and
the alkaline gas supplying mechanism includes an alkaline liquid retaining portion provided in the standby pot below the standby position for retaining a volatile alkaline liquid from which the alkaline gas is liberated and thereby supplied to the surface of the scrub brush; and further comprising
a liquid receiving member comprising a barrier provided in the standby pot above the alkaline liquid retaining portion for suppressing or preventing intrusion of any other liquid into the alkaline liquid retaining portion.

\* \* \* \* \*